United States Patent
Haidar

(10) Patent No.: US 10,233,095 B1
(45) Date of Patent: *Mar. 19, 2019

(54) SOLAR DESALINATION AND POWER GENERATING SYSTEM

(71) Applicant: KING SAUD UNIVERSITY, Riyadh (SA)

(72) Inventor: Zeyad Abdulwahid Ghaleb Haidar, Riyadh (SA)

(73) Assignee: King Saud University, Riyadh (SA)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,804

(22) Filed: May 24, 2018

Related U.S. Application Data

(63) Continuation-in-part of application No. 15/900,692, filed on Feb. 20, 2018.

(51) Int. Cl.
*C02F 1/14* (2006.01)
*B01D 5/00* (2006.01)
(Continued)

(52) U.S. Cl.
CPC ............ *C02F 1/14* (2013.01); *B01D 5/006* (2013.01); *B01D 5/009* (2013.01); *B01D 5/0075* (2013.01);
(Continued)

(58) Field of Classification Search
CPC .......... C02F 1/043; C02F 1/14; B01D 1/0035; B01D 3/008; B01D 3/02; B01D 3/10; B01D 5/0066
See application file for complete search history.

(56) References Cited

U.S. PATENT DOCUMENTS

| 4,194,949 A * | 3/1980 | Stark ................ B01D 3/00 202/180 |
| 4,235,679 A * | 11/1980 | Swaidan ............ B01D 5/0066 202/234 |

(Continued)

FOREIGN PATENT DOCUMENTS

| CN | 1624396 A | 6/2005 |
| CN | 106927531 A | 7/2017 |

(Continued)

OTHER PUBLICATIONS

Deniz, Emrah. "Solar-Powered Desalination." Desalination Updates. InTech, 2015.

(Continued)

*Primary Examiner* — Jonathan Miller
(74) *Attorney, Agent, or Firm* — Richard C. Litman

(57) ABSTRACT

The solar desalination and power generating system is a hybrid system combining a Fresnel solar concentrator with a solar desalination still, and further including at least one concentrating photovoltaic cell for simultaneously generating electrical power. The solar still includes an absorber base, at least one sidewall, and a hollow cover. The hollow cover has an inlet port for receiving seawater, which passes through an interior of the hollow cover and exits through at least one outlet port into an open interior region of the solar still. At least one collection duct collects pure water condensate. A vacuum pump selectively lowers the pressure within the open interior region of the solar still. The solar still is suspended above a linear Fresnel reflector array such that the at least one concentrating photovoltaic cell, mounted to a lower surface of the absorber base, is positioned at a focal line thereof.

8 Claims, 6 Drawing Sheets

(51) Int. Cl.
*H01L 31/0525* (2014.01)
*H02S 40/44* (2014.01)
*H01L 31/054* (2014.01)
*C02F 103/08* (2006.01)

(52) U.S. Cl.
CPC ...... *H01L 31/0525* (2013.01); *H01L 31/0543* (2014.12); *H02S 40/44* (2014.12); *C02F 2103/08* (2013.01)

(56) References Cited

U.S. PATENT DOCUMENTS

| | | | |
|---|---|---|---|
| 4,249,516 A | 2/1981 | Stark | |
| 4,312,709 A * | 1/1982 | Stark | B01D 5/0066 202/83 |
| 4,323,052 A * | 4/1982 | Stark | C02F 1/14 126/571 |
| 4,383,891 A * | 5/1983 | Clavier | B01D 5/0066 202/234 |
| 4,487,659 A * | 12/1984 | Stark | C02F 1/14 202/172 |
| 4,504,362 A * | 3/1985 | Kruse | C02F 1/14 203/3 |
| 5,053,110 A * | 10/1991 | Deutsch | B01D 3/02 202/176 |
| 5,067,272 A * | 11/1991 | Constantz | A01G 25/00 202/234 |
| 5,181,991 A * | 1/1993 | Deutsch | B01D 5/0066 202/176 |
| 5,348,622 A * | 9/1994 | Deutsch | B01D 3/42 202/176 |
| 6,220,241 B1 * | 4/2001 | Yeomans | F24J 2/07 126/565 |
| 6,500,216 B1 * | 12/2002 | Takayasu | B01D 1/16 23/303 |
| 6,797,124 B2 * | 9/2004 | Ludwig | B01D 5/0066 202/234 |
| 8,056,554 B2 * | 11/2011 | Hinderling | B63B 35/44 126/628 |
| 8,088,257 B2 * | 1/2012 | Kemp | B01D 1/0035 202/234 |
| 8,419,904 B2 | 4/2013 | Ba-abbad et al. | |
| 9,259,662 B2 | 2/2016 | Lee | |
| 2012/0228114 A1 * | 9/2012 | Joseph, III | B01D 1/0035 202/172 |
| 2013/0087184 A1 | 4/2013 | Tran et al. | |
| 2015/0298991 A1 | 10/2015 | Salama | |
| 2015/0353379 A1 * | 12/2015 | Lee | C02F 1/14 203/10 |
| 2017/0275182 A1 | 9/2017 | Alshahrani | |

FOREIGN PATENT DOCUMENTS

| | | |
|---|---|---|
| KR | 20120071023 A | 7/2012 |
| WO | 2017107020 A1 | 6/2017 |

OTHER PUBLICATIONS

Xie et al., "Concentrated solar energy applications using Fresnel lenses: A review," Renewable and Sustainable Energy Reviews, 15 (2011) 2588-2606.

Tiwari et al., "Review on Solar Thermal Power Concentrators," Open Access Journal of Photoenergy, vol. 1, Issue 3, Dec. 29, 2017.

* cited by examiner

SOLAR DESALINATION AND POWER GENERATING SYSTEM

CROSS-REFERENCE TO RELATED APPLICATION

This application is a continuation-in-part of U.S. patent application Ser. No. 15/900,692, filed on Feb. 20, 2018.

BACKGROUND

1. Field

The disclosure of the present patent application relates to desalination of salt water, such as a stream of seawater, and particularly to a solar desalination and power generating system combining a Fresnel solar concentrator with a solar desalination still, and further including at least one concentrating photovoltaic cell for simultaneously generating electrical power.

2. Description of the Related Art

The provision of fresh water is becoming an increasingly important issue in many areas of the world. The increasing world population growth together with increasing industrial and agricultural activities all over the world contributes to the depletion and pollution of fresh water resources. Although water is an abundant natural resource that covers three-quarters of the planet's surface, only about 3% of all water sources are potable. Remote and arid regions depend on underground water for drinking. In arid areas, potable water is very scarce, and the establishment of a human habitat in these areas strongly depends on how such water can be made available. In some instances, the salinity is too high for water to be considered as fresh drinking water. The salinity of such brackish water varies with location. In such cases, fresh water has to be either transported over long distances or distributed through an expensive and complex water network, typically at extremely high cost for a small population.

The rapidly increasing need for energy, along with environmental concerns, has focused much attention on renewable energy sources. The use of solar energy is more economical than the use of fossil fuel, particularly in remote areas having low population densities, low rainfall, and abundant available solar energy. A simple solar still can easily produce the water needed for drinking and cooking for households without access to potable water. In a typical solar desalination process, the productivity of a conventional solar still is in the range of 2-5 L/m²/day, which is far less than that of traditional (i.e., powered by electricity and/or fossil fuels) desalination systems. The benefits of solar power are great. Thus, it would obviously be desirable to be able to optimize the efficiency of a solar still.

Various parameters affect both efficiency and productivity of a solar still. The distilled water production rate can be increased by varying the overall design of the solar still, the depth of water, the salt concentration, the location, and both the absorbing materials and evaporative techniques employed. FIG. 2 illustrates a typical vacuum-assisted solar still 100. Here, a vacuum pump is used to enhance the productivity of the solar still. A basin 102 contains a volume of brine B to be desalinated. The basin 102 is covered by a transparent glass panel 104 through which solar radiation S can pass. The solar radiation S heats the brine B to produce evaporated water vapor V. The water vapor V is cooled on the interior surface of the transparent glass panel 104, where it condenses. As shown, the transparent glass panel 104 is angled or sloped so that the condensate C drips down the interior surface to be collected in a reservoir 106. The reservoir 106 can then be tapped to collect the distillate, which may be used as clean drinking water. In order to increase the rate of evaporation within the basin 102, a vacuum pump 108 is selectively actuated to decrease the pressure within the basin 102. Since the vacuum pump 108 will remove some of the water vapor V while it is being operated, this additional source of pure water can be collected as additional distillate, which may either be collected separately or mixed with the primary source of distillate (i.e., collected from reservoir 106).

For an operating temperature of about 60° C., an interior pressure of 20 kPa is sufficient to initiate boiling of brine B within the solar still 100. For a conventional vacuum-assisted solar still, such as solar still 100, an increase in efficiency of about 20% can be expected when compared against a conventional solar still without the additional vacuum pump. Although this is a significant improvement in distilled water production, the production rate is still not equivalent to that of a conventional desalination process. It would obviously be desirable to be able to further modify the vacuum-assisted solar still to increase the production rate of potable water, but without requiring the use of additional sources of energy, such as electricity or fossil fuels. Thus, a solar desalination and power generating system solving the aforementioned problems is desired.

SUMMARY

The solar desalination and power generating system is a hybrid system, combining a Fresnel solar concentrator with a solar desalination still, and further including at least one concentrating photovoltaic cell for simultaneously generating electrical power. The solar still includes an absorber base having opposed upper and lower surfaces and at least one sidewall having opposed upper and lower edges. The lower edge of the at least one sidewall is secured to the upper surface of the absorber base, defining an open interior region. The at least one sidewall includes a vacuum port and at least one condensate retrieval port. A hollow cover is secured to and covers the upper edge of the at least one sidewall. The hollow cover has an inlet port for receiving seawater such that the seawater passes through the interior of the hollow cover and exits through at least one outlet port.

At least one collection duct is secured to an inner face of the at least one sidewall for collecting pure water condensate. The at least one collection duct is in fluid communication with the at least one condensate retrieval port. A distribution conduit is in fluid communication with the at least one outlet port for transferring the seawater from the hollow cover to the open interior region of the solar still. A condensate retrieval conduit is in fluid communication with the at least one condensate retrieval port for extracting the pure water condensate.

A vacuum pump is in fluid communication with the open interior region of the solar still through the vacuum port for selectively lowering the pressure within the open interior region of the solar still. At least one concentrating photovoltaic cell or panel is secured to, and is in thermal communication with, the lower surface of the absorber base. The solar still is suspended above a linear Fresnel reflector array such that the least one concentrating photovoltaic cell is positioned at a focal line of the linear Fresnel reflector array. A closed, optically transparent housing is preferably secured to and covers the lower surface of the absorber base to prevent heat loss from the absorber base through convective heat transfer with the ambient environment. The at least one concentrating photovoltaic cell generates electrical power for an external load and/or electrically-driven elements of the solar desalination and power generating system from solar radiation being focused thereon by the Fresnel reflector array. Thermal energy generated by the solar radiation being focused on the at least one concentrating photovoltaic cell is transferred to the absorber base through thermal conduction. In the solar desalination and power generating system, cooling of the concentrating photovoltaic cells is effected through thermal transfer with the absorber base. Not only does this heat transfer perform the necessary cooling of the concentrating photovoltaic cells, but it uses this heat, which would ordinarily be seen as waste heat in a conventional concentrating photovoltaic cell-based power system, in the performance of the water distillation.

These and other features of the present invention will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 3:
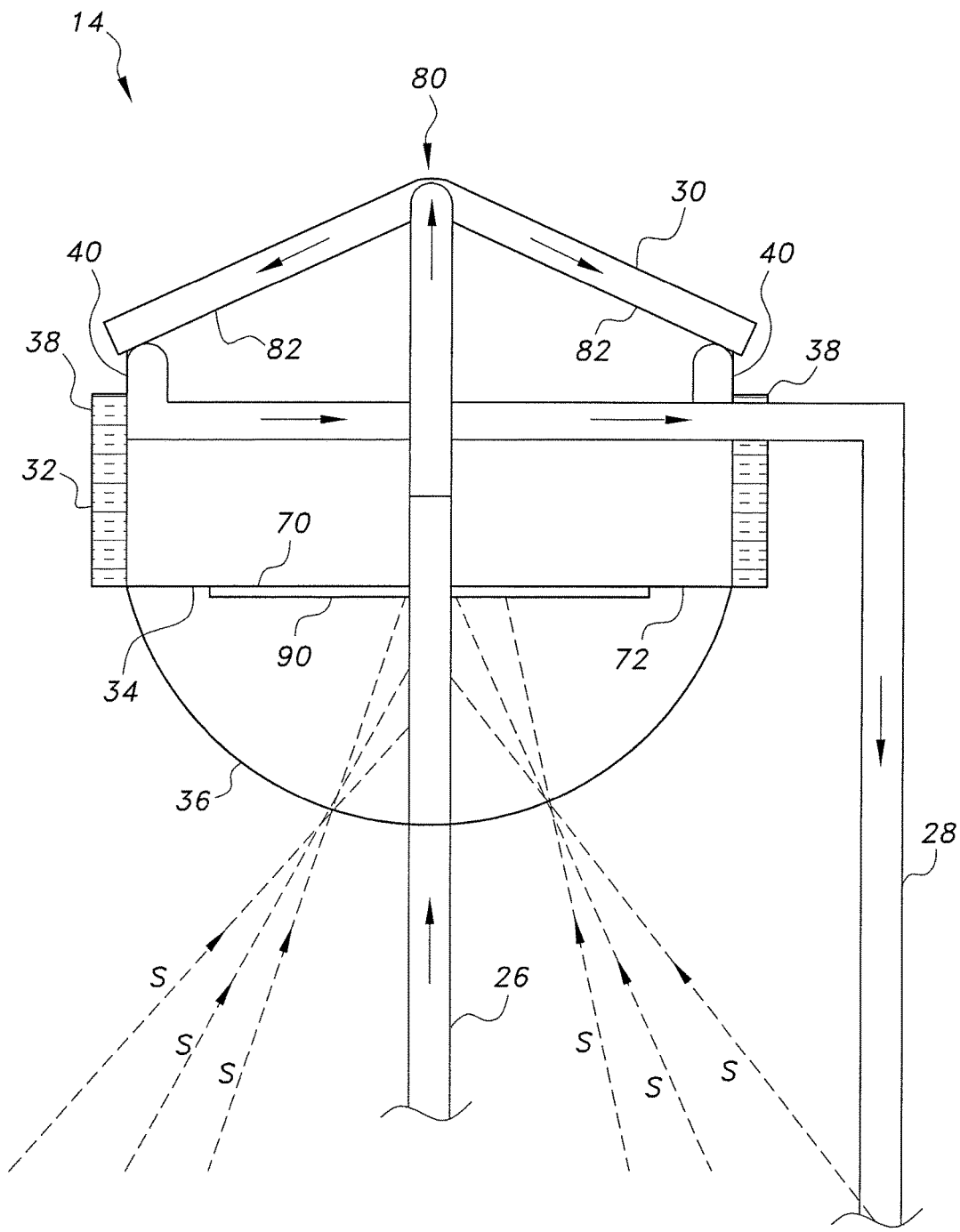
FIG. 3 is a schematic diagram of a solar still of the solar desalination and power generating system.
Figure 4:
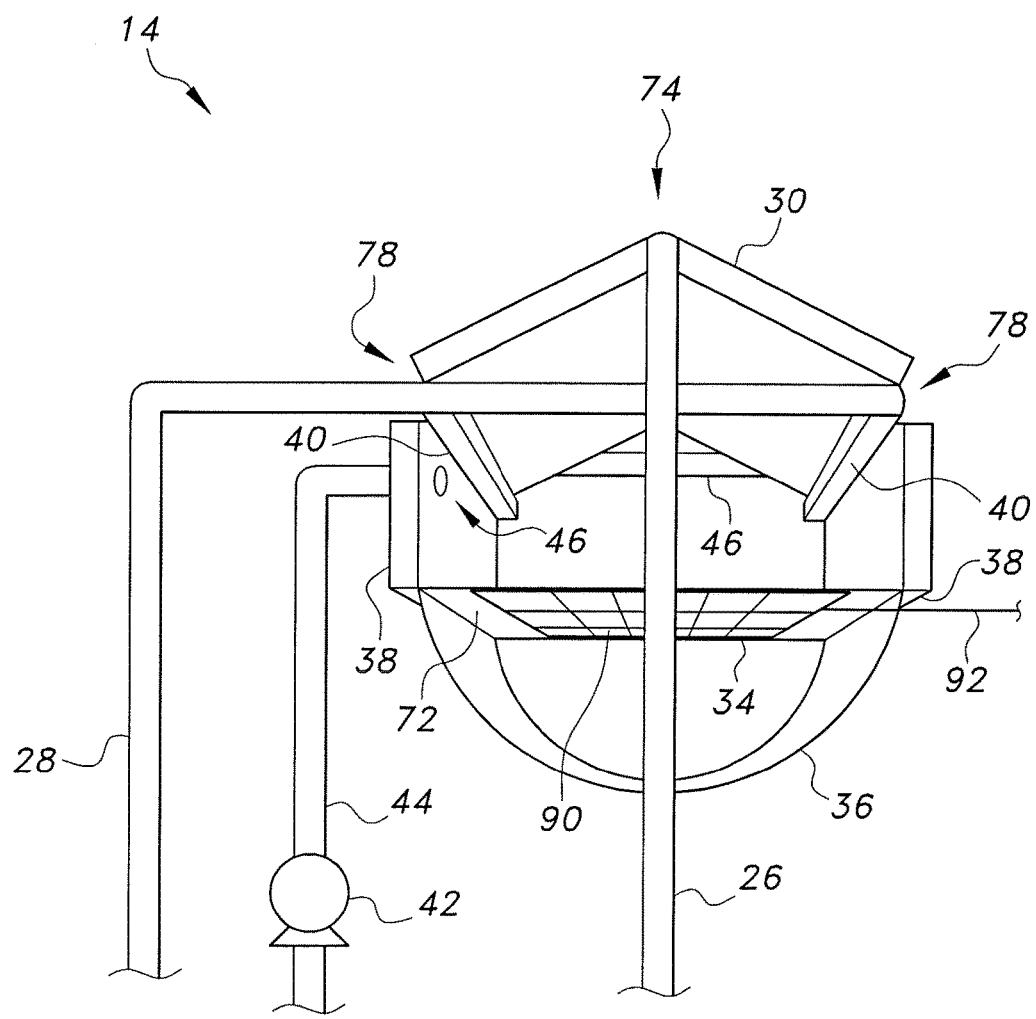
FIG. 4 is a partial perspective view of the solar still, largely diagrammatic, showing additional details thereof.
Figure 5:
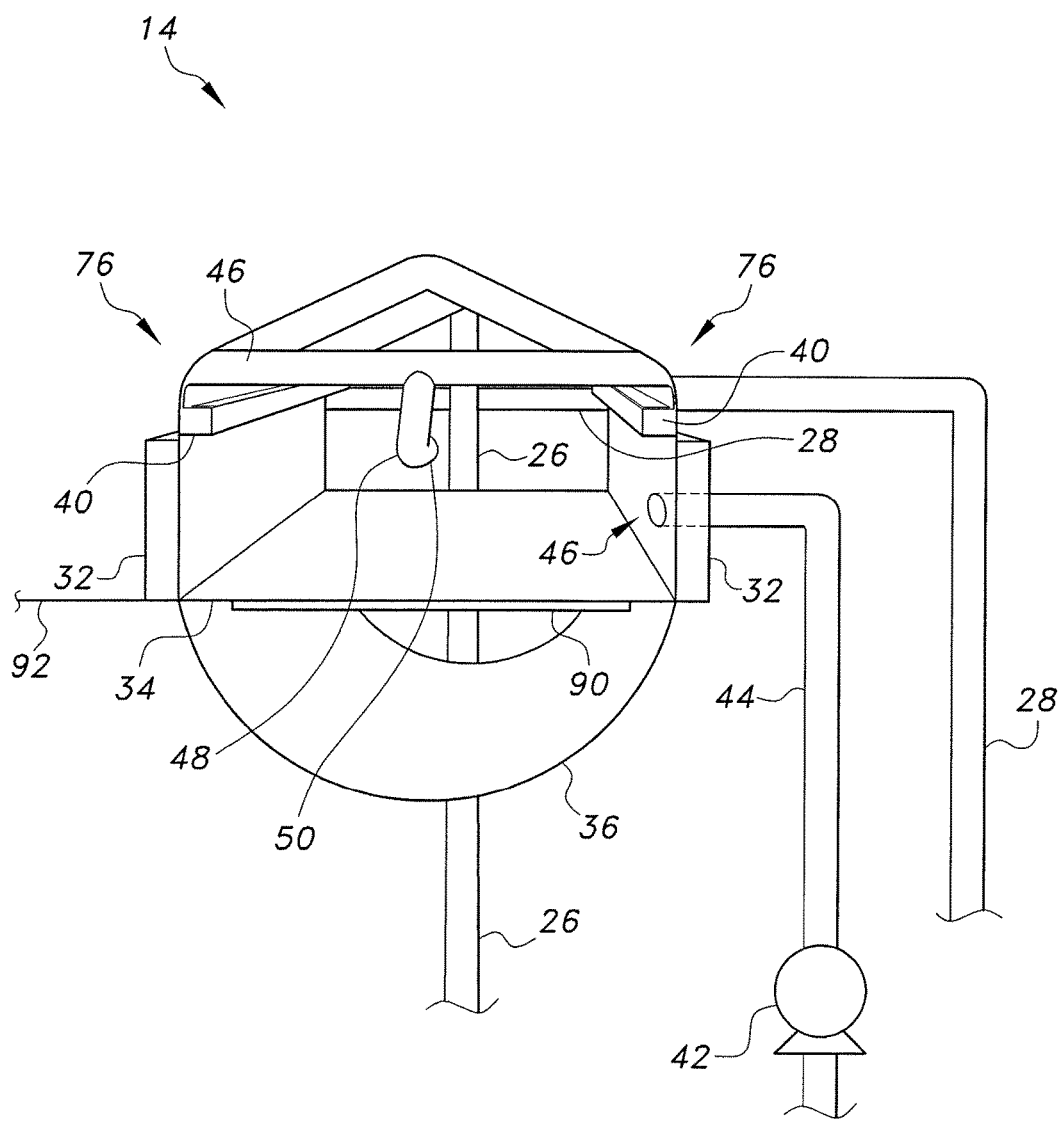
FIG. 5 is a schematic diagram of the solar still, shown from a perspective 180° opposite FIG. 3.

The solar desalination and power generating system 10 is a hybrid system, combining a Fresnel solar concentrator with a solar desalination still, and further including at least one concentrating photovoltaic cell or panel for simultaneously generating electrical power. As best seen in FIGS. 3-5, the solar still 14 includes an absorber base 34, having opposed upper and lower surfaces 70, 72, respectively, and at least one sidewall 38 having opposed upper and lower edges. The lower edge of the at least one sidewall 38 is secured to the upper surface 70 of the absorber base 34, defining an open interior region.

Figure 6:
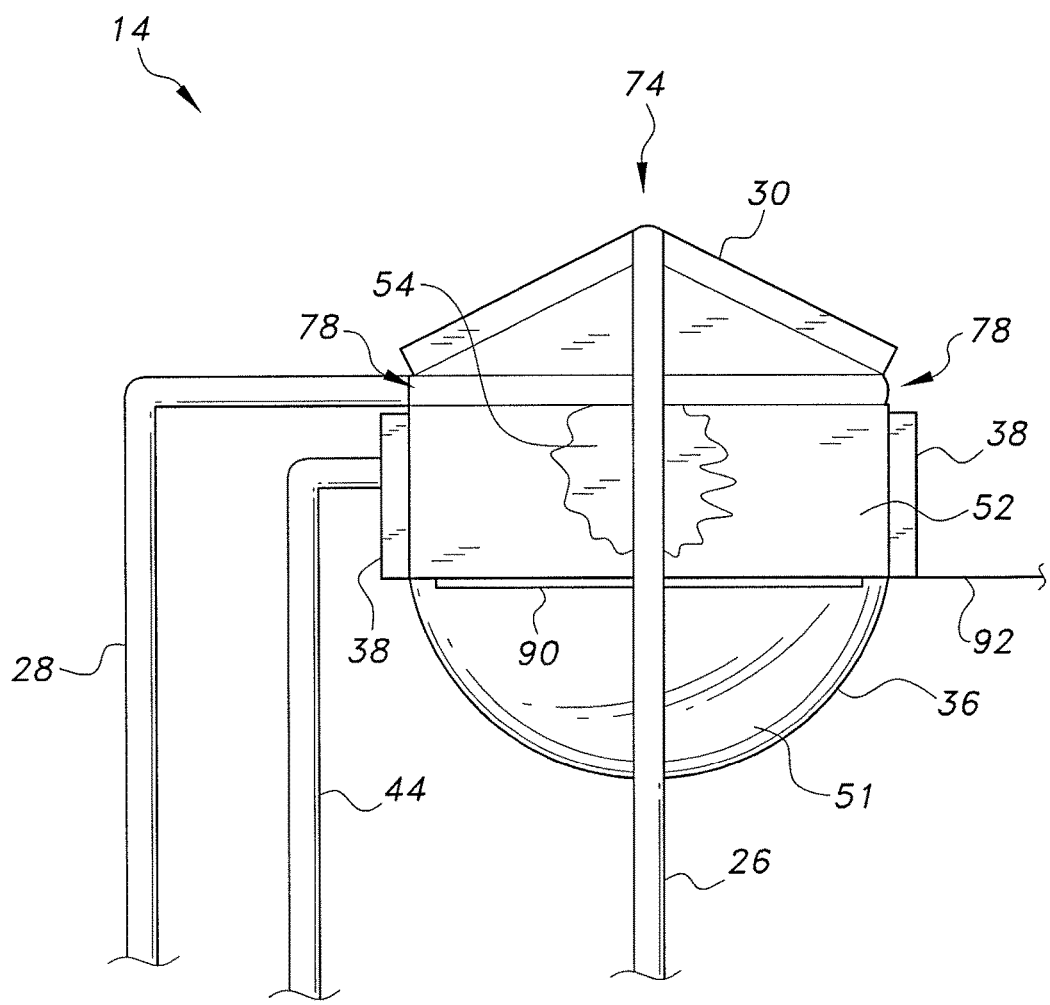
FIG. 6 is a front elevation view of the solar still, shown with the front wall broken away to show the opposite rear wall.

In FIGS. 4 and 5, the absorber base 34 is shown as being rectangular, and the at least one sidewall 38 is shown as four corresponding walls, defining a rectangular interior. It should be understood that the overall configuration and relative dimensions of the absorber base 34 and the at least one sidewall 38 are shown for exemplary purposes only. Further, in FIGS. 4 and 5, the solar still 14 is shown as being open, i.e., FIGS. 4 and 5 show the solar still only having a pair of opposed sidewalls 38. It should be understood that this open configuration is shown for purposes of clarity and illustration only. As shown in FIG. 6, the solar still 14 (in the rectangular example described above) further includes front and rear walls 52, 54, respectively. Coupled with a hollow cover 30, as will be described in greater detail below, the absorber base 34, the at least one sidewall 38, and the hollow cover 30 form a fluid-tight open interior region.

Additionally, as best seen in FIGS. 3 and 4, at least one concentrating photovoltaic cell 90 or panel is secured to, and is in thermal communication with, the lower surface 72 of the absorber base 34. As is well known in the art, as opposed to a conventional photovoltaic cell, a concentrating photovoltaic cell uses lenses and/or curved mirrors to focus light onto small, but highly efficient, multi-junction (MJ) solar cells. As will be described in greater detail below, a linear Fresnel reflector array 20 focuses solar radiation S on the at least one concentrating photovoltaic cell 90, which is secured to the lower surface 72 of the absorber base 34. The absorber base 34 may be made from any suitable type of metal or material having a high degree of thermal conductivity and a high melting temperature. The at least one sidewall 38 may be made from any suitable type of material having a high degree of thermal insulation and/or may be covered by an additional layer of thermal insulation material. Alternatively, the at least one sidewall 38 may be formed from a material similar to that of absorber base 34, with thermal insulation being provided by additional layers of insulation 32. In use, the at least one concentrating photovoltaic cell 90 generates electrical power for an external load and/or electrically-driven elements of the solar desalination and power generating system 10 (such as vacuum pump 42, for example) from solar radiation being focused thereon by the Fresnel reflector array 20. Thermal energy generated by the solar radiation S being focused on the at least one concentrating photovoltaic cell 90 is transferred to the absorber base 34 through thermal conduction. It should be understood that electrical conductor 92, for delivering electrical power generated by the at least one concentrating photovoltaic cell 90 to the external load and/or electrically-driven elements of the solar desalination and power generating system 10, is shown for illustrative and exemplary purposes only, and that any suitable type of wire, cables and associated circuitry may be utilized. In the solar desalination and power generating system 10, cooling of the at least one concentrating photovoltaic cell 90 is effected through thermal transfer with the absorber base 34. Not only does this heat transfer perform the necessary cooling of the at least one concentrating photovoltaic cell 90, but, as will be described in greater detail below, this heat being transferred, which would ordinarily be seen as waste heat in a conventional concentrating photovoltaic cell-based power system, is used in the performance of water distillation by the solar desalination still.

As shown in FIG. 4, the at least one sidewall 38 includes a vacuum port 46 and at least one condensate retrieval port 78. In the rectangular example of FIGS. 4-6, the at least one condensate retrieval port 78 is formed through the front wall 52. As noted above, a hollow cover 30 is secured to and covers the upper edge of the at least one sidewall 38. The hollow cover 30 has an inlet port 74 for receiving seawater such that the seawater passes through the interior of the hollow cover 30 and exits through at least one outlet port 76 (as shown in FIG. 5).

At least one collection duct 40 is secured to an inner face of the at least one sidewall 38 for collecting pure water condensate. The at least one collection duct 40 is in fluid communication with the at least one condensate retrieval port 78. As shown in FIG. 5, a distribution conduit 46 is in fluid communication with the at least one outlet port 76 for transferring the seawater from the hollow cover 30 to the open interior region of the solar still 14. In the example shown in FIG. 5, a pair of outlet ports 76 are provided and the distribution conduit 46 communicates with both of the outlet ports 76 and extends therebetween. An additional pipe 48, nozzle, faucet or the like may be added to the distribution conduit 46, as shown, for dispensing the seawater into the open interior region of the solar still 14. A valve 50 may selectively seal the additional pipe 48, allowing the seawater to feed into the open interior region of solar still 14 only at selected times and/or under user control. It should be understood that the substantially L-shaped pipe 48 is shown for exemplary purposes only. Further, it should be understood that any suitable type of valve 50 may be used for selectively controlling the dispensing of the seawater into the open interior region of the solar still 14. As shown in FIG. 4, a condensate retrieval conduit 28 is in fluid communication with the at least one condensate retrieval port 78 for extracting pure water condensate.

As shown in FIG. 3, the hollow cover 30 may have an inverted, substantially V-shaped or gable roof configuration such that the hollow cover 30 has a central apex 80 and a pair of lower edges 82. For the substantially rectangular exemplary configuration of FIGS. 4-6, a pair of collection ducts 40 are provided (positioned on opposed sidewalls) such that the pair of collection ducts 40 may be respectively positioned adjacent the pair of lower edges 82 of the hollow cover 30. Distilled water condensing on the roof inside the still rolls down the sloping roof panels into the collection ducts 40.

Figure 1:
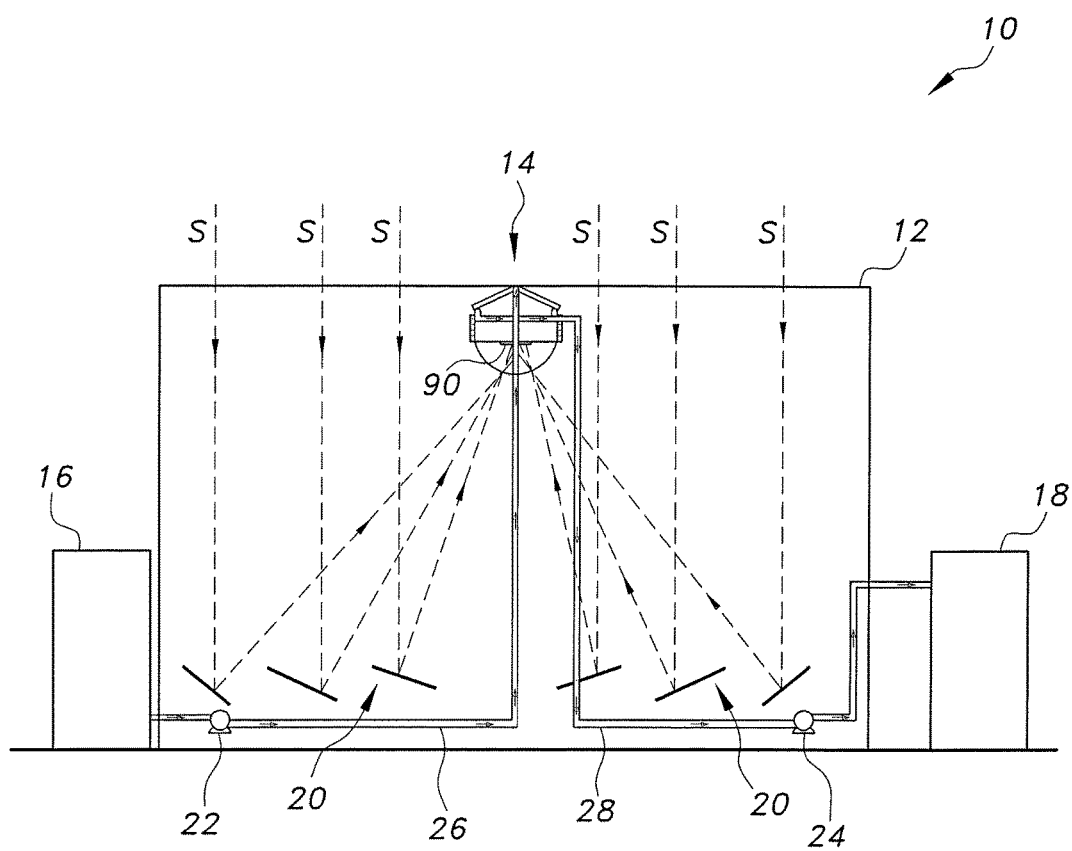
FIG. 1 is a schematic diagram illustrating a solar desalination and power generating system.
Figure 2:
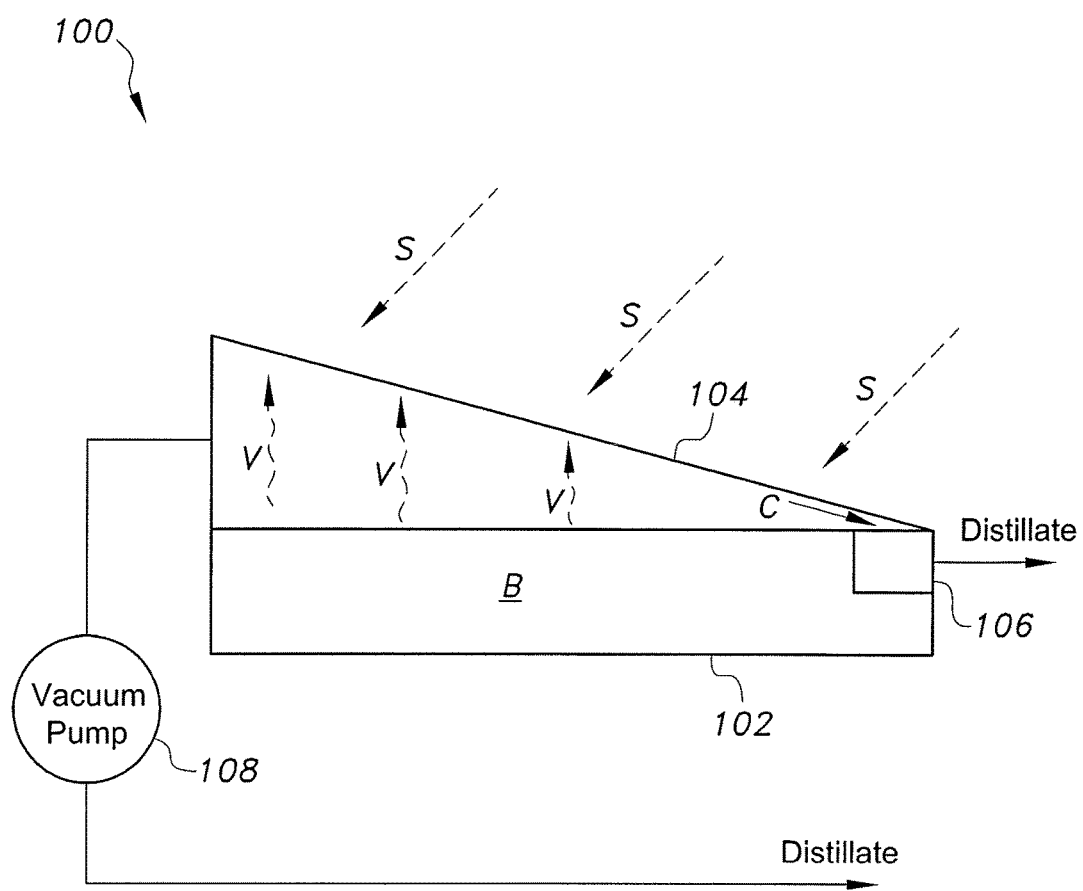
FIG. 2 is a schematic diagram illustrating a conventional vacuum-assisted solar still of the prior art.

As shown in FIG. 1, the solar still 14 is suspended above a linear Fresnel reflector array 20. The solar still 14 is supported by any suitable type of support structure 12 such that the at least one concentrating photovoltaic cell 90, which is secured to the lower surface 72 of the absorber base 34, is located at the focal line of the linear Fresnel reflector array 20. In use, the linear Fresnel reflector array 20 focuses solar radiation S on the at least one concentrating photovoltaic cell 90, which generates electrical power for powering an external electrical load and/or electrical components of system 10. Thermal energy generated by the focusing of solar radiation S onto the at least one concentrating photovoltaic cell 90 or panel is transferred to the absorber base 34 through conduction. This heat energy is then transferred to the seawater contained in the open interior region of the solar still 14. Pure water vapor then evaporates from the seawater contained in the open interior region of solar still 14. As noted above, the heat transfer from the at least one concentrating photovoltaic cell 90 or panel to the absorber base 34 provides the cooling necessary to the operation of the at least one concentrating photovoltaic cell 90.

The passage of the seawater through the hollow cover 30 decreases the temperature of the hollow cover 30 (through convective heat transfer), thus allowing the pure water vapor to condense on the inner surface of the hollow cover 30. This pure water condensate drips down the angled inner faces of the hollow cover 30 by gravity and is collected in the pair of collection ducts 40. In this exemplary configuration, a pair of outlet ports 78 are provided in communication with the pair of collection ducts 40, respectively, for extracting the pure water condensate therefrom. The condensate retrieval conduit 28 is in communication with the pair of outlet ports 78 for extracting the pure water condensate.

As shown in FIG. 1, the seawater to be desalinated may be initially stored in a seawater tank 16. A first pump 22 selectively transfers the seawater from the seawater tank 16 to the interior of the hollow cover 30 through inlet port 74 via the seawater transfer conduit 26. Similarly, the extracted pure water condensate may be stored in a pure water tank 18.

A second pump 24 selectively transfers the pure water condensate to the pure water tank 18 from the at least one condensate retrieval port 78 through the condensate retrieval conduit 28.

A vacuum pump 42 is in fluid communication with the open interior region of the solar still 14 through the vacuum port 46 (via vacuum conduit 44) for selectively lowering the pressure within the open interior region of the solar still 14, thus increasing the rate of evaporation of the seawater. Linear Fresnel reflector arrays can generate temperatures well above 100° C. However, the vacuum pump 42, by lowering the pressure within the solar still 14, can decrease the boiling temperature of water to below 100° C., thus greatly increasing the evaporation rate of the seawater through the combination of high temperature and lowered boiling point. Additionally, as the seawater passes through the hollow cover 30, the seawater not only lowers the temperature of the hollow cover 30 (thus allowing the water vapor to condense on its inner surface), but through heat exchange with the water vapor, the seawater increases in temperature. Thus, the seawater is preheated by this heat exchange process before being heated by the concentrated solar radiation S and having its boiling point lowered by operation of the vacuum pump 42.

Further, a closed, optically transparent housing 36 may be secured to and cover the lower surface 72 of the absorber base 34 to prevent heat loss from the absorber base 34 and the at least one concentrating photovoltaic cell 90 through convective heat transfer with the ambient environment. A vacuum may be formed within the closed, optically transparent housing 36 to further enhance the thermal insulation. In FIGS. 4 and 5, the optically transparent housing 36 is shown as being open. It should be understood that this open configuration is shown for purposes of clarity and illustration only. FIG. 6 shows an additional front wall 51, with it being understood that there should be an additional rear wall, thus forming a closed housing. The closed, optically transparent housing 36 allows the focused solar radiation S to reach the at least one concentrating photovoltaic cell 90 without environmental air extracting heat from the at least one concentrating photovoltaic cell 90 and absorber base 34 through convective heat transfer.

It is to be understood that the solar desalination and power generating system is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:
1. A solar desalination and power generating system, comprising:
   a solar still consisting of:
      an absorber base having opposed upper and lower surfaces;
      at least one sidewall having opposed upper and lower edges, the lower edge thereof being secured to the upper surface of the absorber base, the least one sidewall having a vacuum port and at least one condensate retrieval port;
      a hollow cover secured to and covering the upper edge of the at least one sidewall, the hollow cover having an inlet port for receiving seawater such that the seawater passes through the hollow cover, the hollow cover having at least one outlet port, the absorber base, at least one sidewall, and hollow cover defining an open interior region;

at least one collection duct secured to an inner face of the at least one sidewall for collecting pure water condensate, the at least one collection duct being in fluid communication with the at least one condensate retrieval port;

a distribution conduit in direct fluid communication with the at least one outlet port for transferring the seawater from the hollow cover to the open interior region of the solar still; and a condensate retrieval conduit in direct fluid communication with the at least one condensate retrieval port for extracting the pure water condensate;

a vacuum pump in direct fluid communication with the open interior region of the solar still through the vacuum port for selectively lowering the pressure within the open interior region of the solar still, wherein the lower pressure within the solar still decreases the boiling temperature of the seawater to below 100° C., thus increasing the evaporation rate of the seawater through the combination of high temperature and lowered boiling point;

at least one concentrating photovoltaic cell secured to, and in direct thermal communication with, the lower surface of the absorber base; and a linear Fresnel reflector array, the solar still being suspended above the linear Fresnel reflector array such that the at least one concentrating photovoltaic cell is positioned at a focal line of the array, the at least one concentrating photovoltaic cell being adapted for generating electrical power for an external load, thermal energy from solar radiation focused on the at least one concentrating photovoltaic cell being transferred to the absorber base through thermal conduction.

2. The solar desalination and power generating system as recited in claim 1, further comprising a closed, optically transparent housing secured to and covering the lower surface of the absorber base, wherein the at least one concentrating photovoltaic cell being enclosed between the optically transparent housing and the absorber base.

3. The solar desalination and power generating system as recited in claim 2, wherein a vacuum is formed between the closed, optically transparent housing and the lower surface of the absorber base.

4. The solar desalination and power generating system as recited in claim 1, further comprising:

a seawater tank adapted for holding seawater; and a first pump selectively transferring the seawater from the seawater tank to the interior of the hollow cover through the inlet port.

5. The solar desalination and power generating system as recited in claim 4, further comprising:

a pure water tank adapted for receiving the pure water condensate; and a second pump selectively transferring the pure water condensate to the pure water tank from the at least one condensate retrieval port through the condensate retrieval conduit.

6. The solar desalination and power generating system as recited in claim 1, wherein the hollow cover has an inverted substantially V-shaped cross-section such that the hollow cover has a central apex and a pair of lower edges.

7. The solar desalination and power generating system as recited in claim 6, wherein the at least one collection duct comprises a pair of collection ducts respectively positioned adjacent the pair of lower edges of the hollow cover.

8. The solar desalination and power generating system as recited in claim 7, wherein the at least one outlet port comprises a pair of outlet ports.

\* \* \* \* \*